United States Patent [19]
Maple

[11] Patent Number: 5,235,223
[45] Date of Patent: Aug. 10, 1993

[54] CONSTANT Q PEAKING FILTER UTILIZING SYNTHETIC INDUCTOR AND SIMULATED CAPACITOR

[75] Inventor: Christopher M. Maple, Reseda, Calif.

[73] Assignee: Harman International Industries, Inc., Northridge, Calif.

[21] Appl. No.: 752,081

[22] Filed: Aug. 29, 1991

[51] Int. Cl.[5] .......................... H03B 1/00; H01P 5/12
[52] U.S. Cl. .................................... 307/521; 328/167; 333/125
[58] Field of Search ............... 307/521, 520, 490, 494; 333/214, 215; 328/167

[56] References Cited

U.S. PATENT DOCUMENTS

| | | | |
|---|---|---|---|
| 3,517,342 | 6/1970 | Orchard et al. | 333/215 X |
| 3,818,359 | 6/1974 | Hekimian | 328/167 |
| 3,835,399 | 9/1974 | Holmes | 328/167 |
| 3,946,328 | 3/1976 | Boctor | 307/521 X |
| 4,272,735 | 6/1981 | Cubbison, Jr. | 333/215 X |
| 4,383,230 | 5/1983 | Manzolini | 333/214 |

Primary Examiner—William L. Sikes
Assistant Examiner—Toan Tran
Attorney, Agent, or Firm—J. E. McTaggart

[57] ABSTRACT

A tunable circuit is disclosed which allows tuning while maintaining a constant Q. The filter uses a synthetic inductor and a capacitance multiplier in place of discrete inductive and capacitive elements. By coupling the synthetic inductor and capacitance through a variable resistor, means are provided for varying the peaking frequency of the circuit while maintaining a constant Q.

8 Claims, 6 Drawing Sheets

CONSTANT Q PEAKING FILTER UTILIZING SYNTHETIC INDUCTOR AND SIMULATED CAPACITOR

FIELD OF INVENTION

The present invention relates generally to filters and, in particular, to tunable filter circuits.

BACKGROUND

One type of bandpass filter circuit used extensively in audio and other signal processing applications is the LC-resonant circuit. Such a circuit comprises resistive, inductive, and capacitive elements and is configured so that the gain of the circuit (i.e., the ratio of the input and output signal amplitudes $V_1$ and $V_0$ respectively) is a maximum at the resonant frequency $\omega_o$ (also called the peak frequency) where $\omega_o = 1/\sqrt{LC}$. An exemplary frequency characteristic of such a circuit is shown in FIG. 1 where gain G is plotted against frequency $\omega$.

Another parameter of interest in such filters $\omega_o$, is the quality factor Q, where Q equals the peak frequency divided by the peak's width (in terms of frequency) at $-3$dB of gain attenuation from the maximum. The Q is thus a measure of the sharpness of the peak. In a typical RLC resonant circuit, the Q may be varied by varying the value of the resistive element. For example, where a sharp peak is not desired, the peak may be broadened to give a flatter frequency response curve by adding what is called a Q-spoiling resistor. For a given resistance the Q of an RLC circuit depends on the ratio of the inductance and capacitance.

Many applications exist, especially in the audio field, for filters of the type described above which are tunable. Tunable filters are those which allow the peak frequency $\omega_o$ to be varied over a range of frequencies. Desirable properties of such tunable filters include independent control of peaking (Q) and tuned frequency ($\omega_o$), control being proportional to the logarithm of the tuned frequency, a wide range over which the filter may be tuned, and the provision of a single control element each for peaking and frequency control. Heretofore, no conventional circuit has managed to provide all of these features in a satisfactory manner. For example, many tunable filter circuits provide a constant bandwidth as the peak frequency is changed rather than a constant Q. This means that the Q rises as the peak frequency is increased and vice-versa. The result, in an audio application, is like listening through a tube as only a narrow band of frequencies is accentuated which band becomes narrower as the peak frequency is raised. Other conventional filter circuits are able to maintain a nearly constant Q by the use of extra components to compensate for the basic properties of the circuit, but this approach will not work over a wide range of frequencies. In order to provide a truly constant Q while tuning over several octaves, conventional circuits have used two control elements mounted on a single shaft to control the peak frequency. This approach, however, is expensive and also can require good matching between the control elements which adds further to the cost. FIG. 2 shows an example of a conventional LRC filter circuit utilizing an op-amp A that allows control of peaking (i.e., Q) by varying resistance R and control of peak frequency by varying capacitance C and inductance L. If C and L change proportionately, the Q factor will remain constant as peak frequency is varied.

SUMMARY OF THE INVENTION

The present invention is a tunable filter circuit which provides all the desirable features enumerated above in a simple, low-cost manner. Instead of using actual inductive and capacitive components configured so as to resonate at the desired peak frequency, the present invention employs a synthetic inductor and a capacitance multiplier constructed with op-amps. The inductance of the synthetic inductor is proportional to a single resistance value in the circuit while the capacitance of the capacitance multiplier is inversely proportional to a similar resistance value. By coupling the synthetic inductor and capacitance multiplier together in an LRC filter circuit through a single potentiometer, the peak frequency of the filter may be varied by changing the setting of the potentiometer which results in the inductance and capacitance of the circuit changing proportionately. The ratio between the inductance and capacitance is thereby maintained at a constant value to maintain a constant Q.

Other objects, features, and advantages of the invention will become evident in light of the following detailed description considered in conjunction with the referenced drawings of a preferred exemplary embodiment according to the present invention.

DETAILED DESCRIPTION OF THE INVENTION

Figure 3:
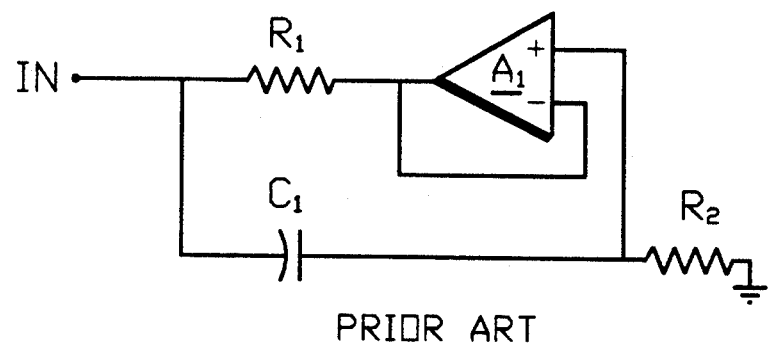
FIG. 3 shows a synthetic inductor.

FIG. 3 shows a typical synthetic inductor made up of an op-amp A1, resistors $R_1$ and $R_2$, and capacitor $C_1$. The inductance L of the circuit, at the terminal labeled IN, is given by the product of the resistance values and the capacitance, i.e.:

$$L = R_1 R_2 C_1$$

In the above formula, and the ones that follow, the reference numbers stand for the values of the respective components assigned the reference number.

Figure 4:
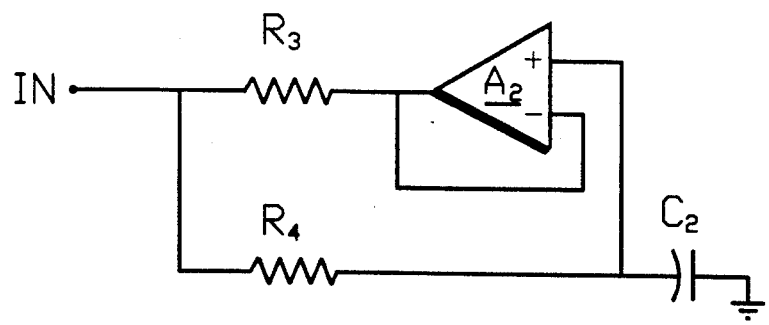
FIG. 4 shows a capacitance multiplier.

FIG. 4 shows a typical capacitance multiplier comprising an op-amp A2, resistors $R_3$ and $R_4$, and capacitor $C_2$. The capacitance C of the circuit, at the IN terminal, is given by the following formula:

$$C = C_2 \frac{R_4}{R_3}$$

Figure 5:
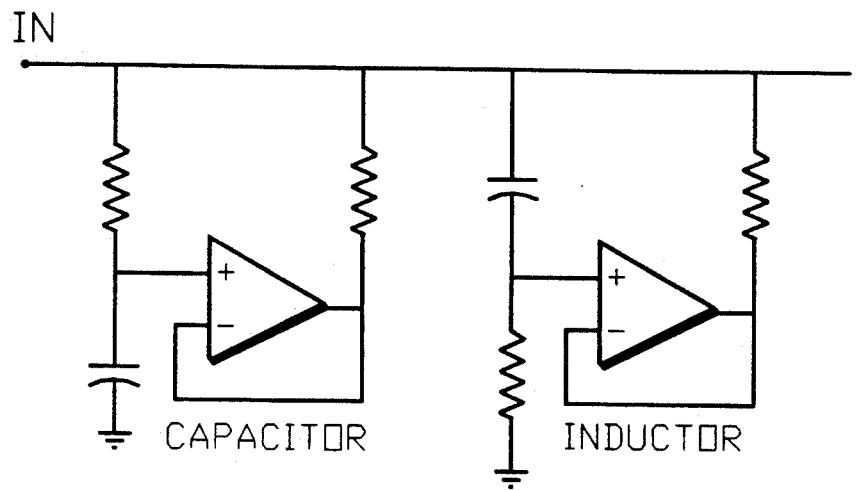
FIG. 5 shows a synthetic inductor and capacitance multiplier coupled together to form a parallel LC resonant circuit.

FIG. 5 shows a simple LRC circuit using a synthetic inductor and capacitance multiplier.

Figure 1:
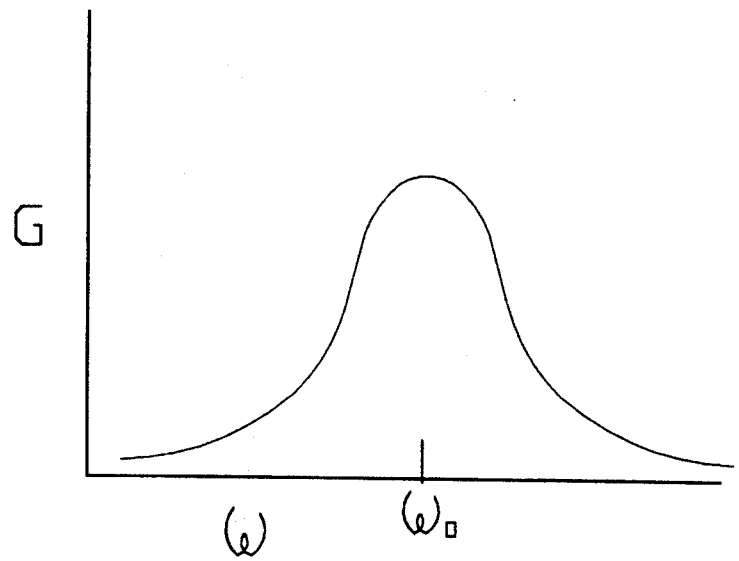
FIG. 1 is depiction of a typical frequency response curve of an LRC bandpass filter circuit.
Figure 2:
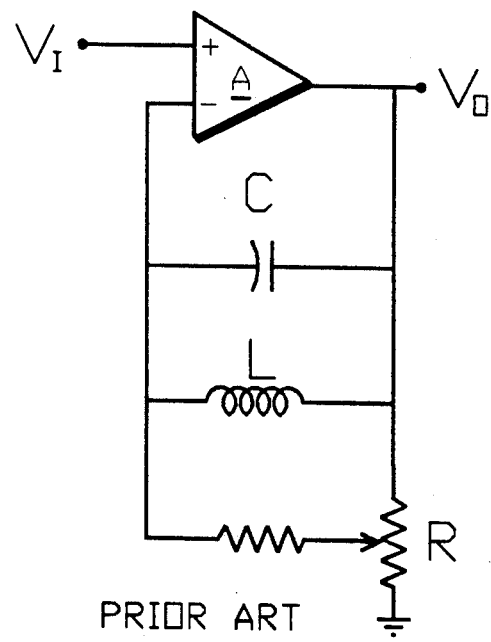
FIG. 2 shows a conventional filter circuit using actual capacitive and inductive components with an op-amp.
Figure 6:
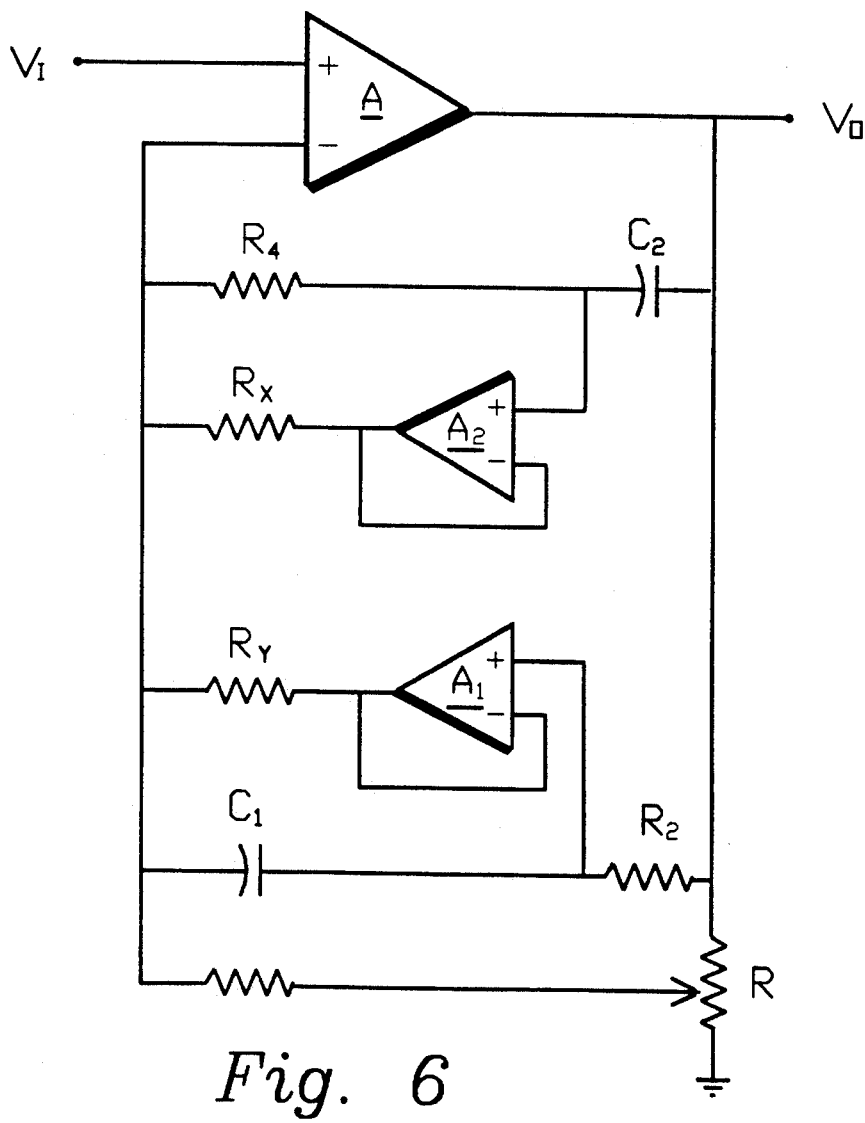
FIG. 6 shows a peaking filter employing an op-amp with a synthetic inductor and capacitance multiplier.
Figure 7:
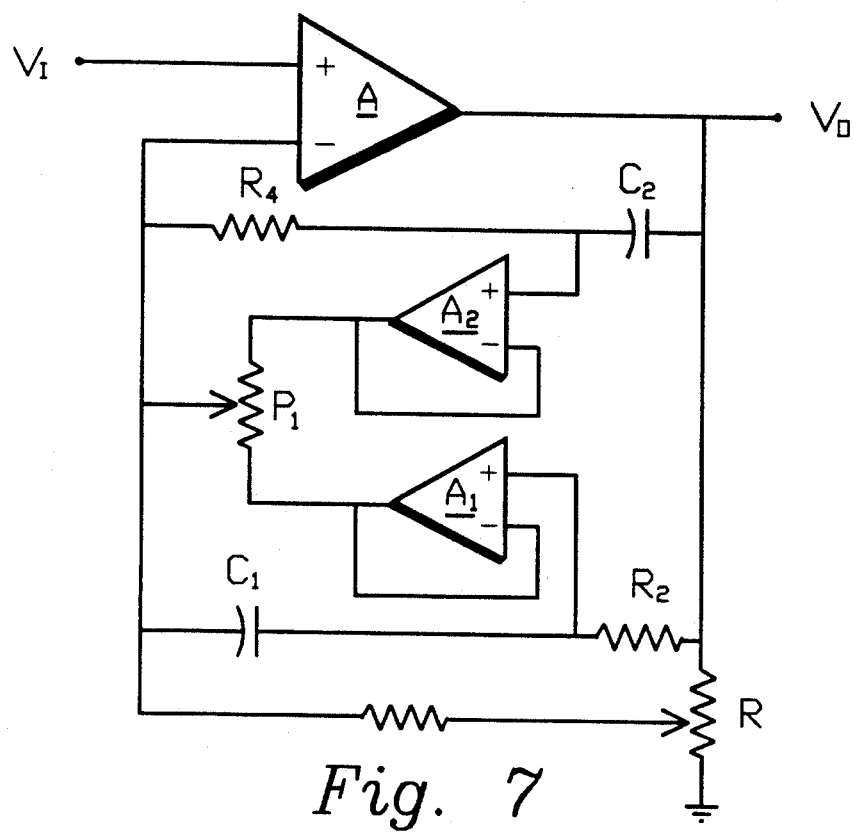
FIG. 7 is the same circuit as in FIG. 6 where Rx and Ry have been combined into a single potentiometer.
Figure 8:
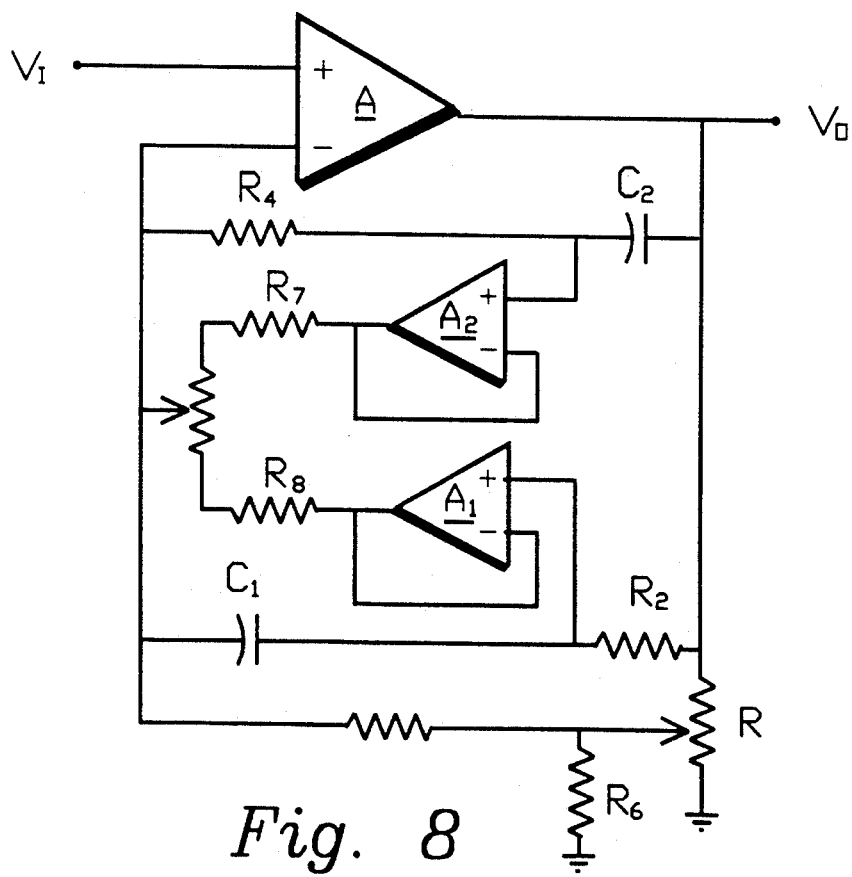
FIG. 8 shows the same circuit as in FIG. 7 to which additional components have been added in order to limit the tuning range and modify the way in which the Q-factor is controlled.

FIG. 6 shows an LRC filter circuit similar to that shown in FIG. 2 but using the synthetic inductor and the capacitive multiplier of FIGS. 3 and 4, respectively, in place of inductor L1 and capacitor C1. The capacitance of the circuit thus varies inversely with $R_x$ while the inductance of the circuit varies directly with $R_y$. FIG. 7 shows the same filter except Rx and Ry have been replaced by a single potentiometer $P_1$ so that as the potentiometer is adjusted, both the capacitance and inductance are made to either increase or decrease by the same amount. In this manner, $\omega_o$ (which equals $1/\sqrt{LC}$) may be varied while holding the ratio between the inductance and capacitance constant which maintains a constant Q. FIG. 8 shows another version of the filter circuit to which resistors $R_7$ and $R_8$ have been added in order to limit the range of tuning. The addition of resistor $R_6$ results in an approximately logarithmic relationship between adjustment of $P_2$ and change in Q.

Figure 9:
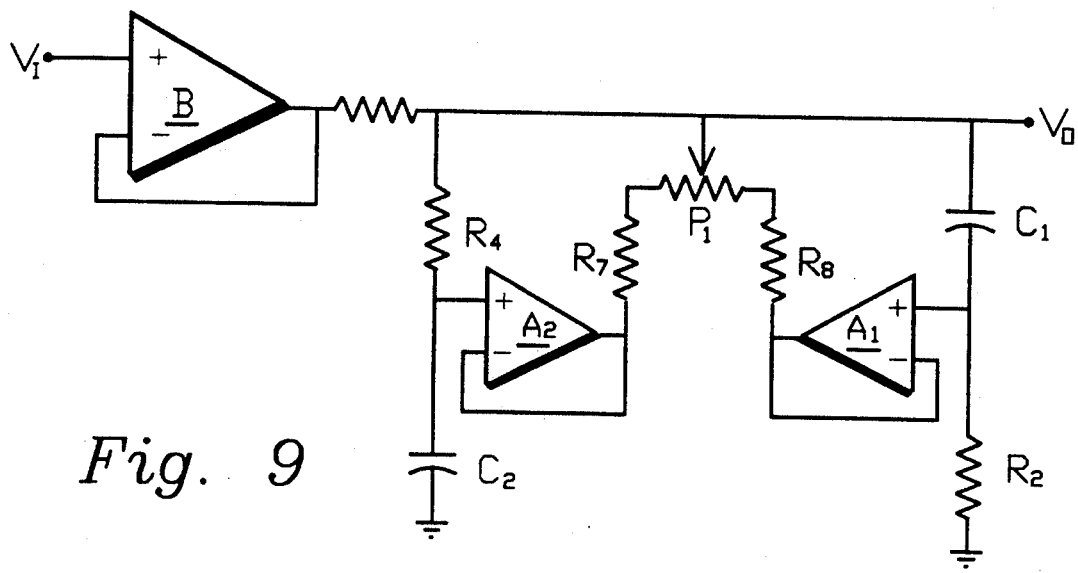
FIG. 9 is a bandpass filter employing a synthetic inductor and a capacitance multiplier.
Figure 10:
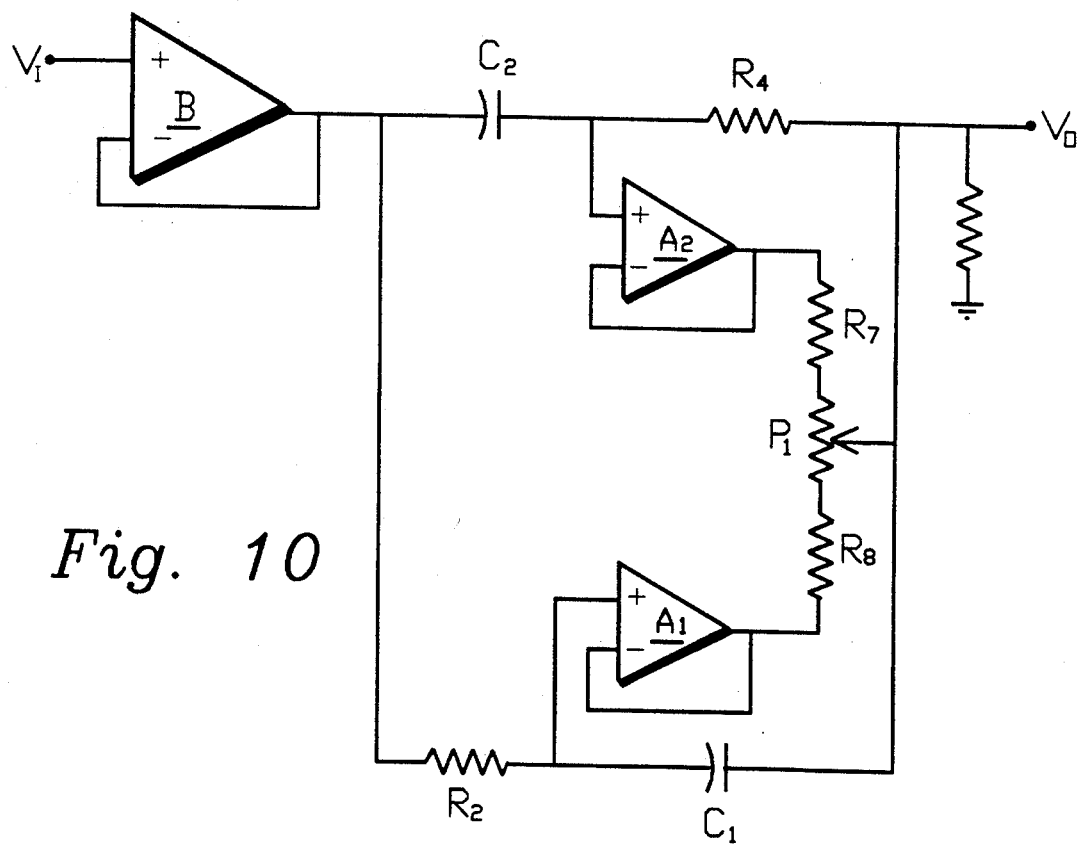
FIG. 10 is a tunable notch filter.
Figure 11:
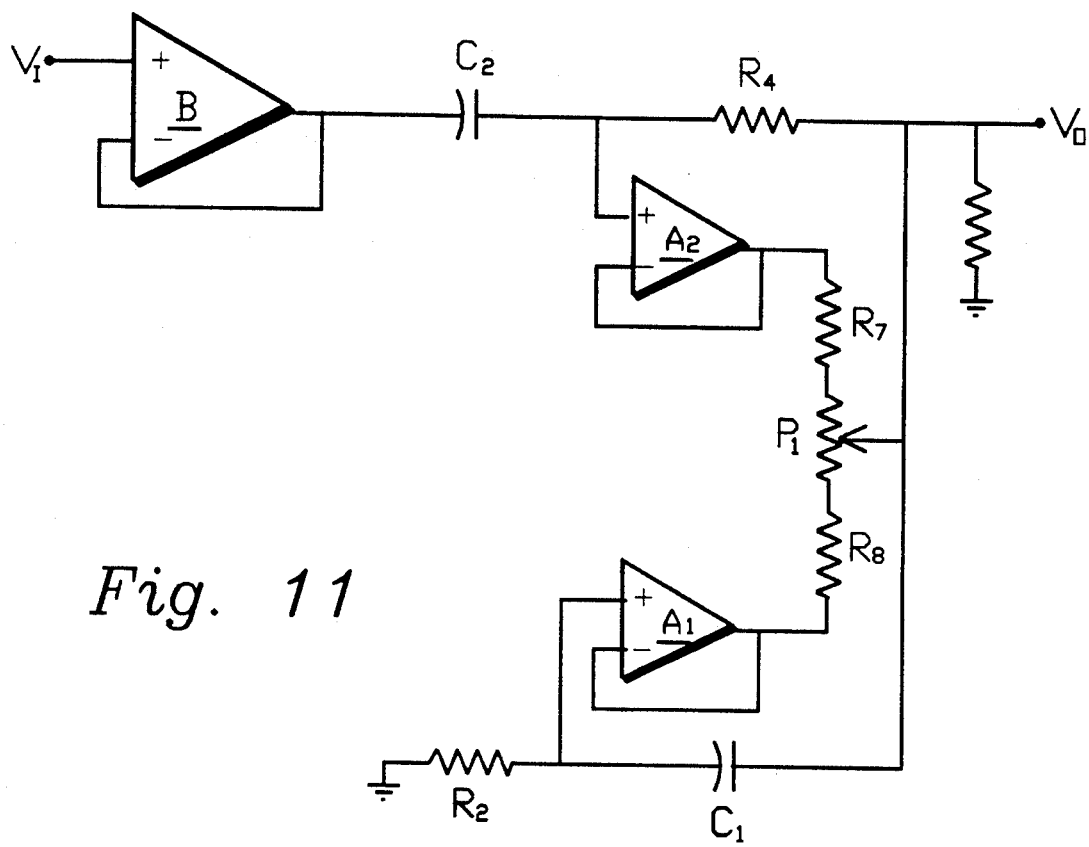
FIG. 11 is a high-pass filter.
Figure 12:
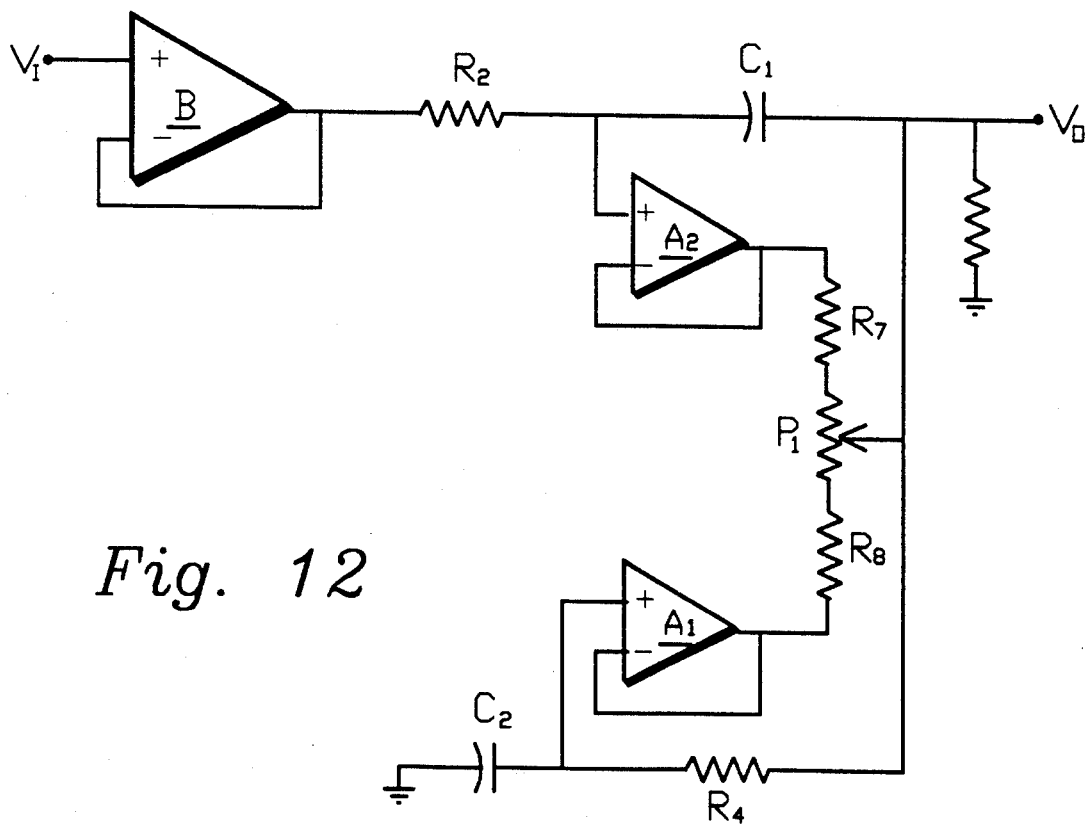
FIG. 12 is a low-pass filter.

FIGS. 9 through 12 show several different embodiments of the present invention where the synthetic inductor and capacitance multiplier are configured in simple RLC circuits instead of used in the feedback path of an op-amp. In all of these embodiments the inductance element comprises an op-amp $A_1$, capacitor $C_1$, resistor $R_2$, resistor $R_8$, and potentiometer $P_1$, while the capacitance element comprises op-amp $A_2$, capacitor $C_2$, resistor $R_4$, resistor $R_7$, and potentiometer $P_1$. A buffer amplifier B is also included in each embodiment. FIG. 9 shows a bandpass filter. FIG. 10 is a tunable notch filter. FIG. 11 depicts a high-pass filter while FIG. 12 shows a low pass filter.

Although the invention has been described in conjunction with the foregoing specific embodiment, many alternatives, variations, and modifications will be apparent to those of ordinary skill in the art. Those alternatives, variations, and modifications are intended to fall within the scope of the following appended claims.

What is claimed is:

1. A tunable filter circuit which maintains a constant Q as the circuit is tuned comprising:
   a synthetic inductor having an inductance dependent on a first resistance;
   a capacitance multiplier having a capacitance dependent on a second resistance;
   and, wherein the first resistance of the synthetic inductor and the second resistance of the capacitance multiplier are coupled together through a first variable resistor so that as the variable resistor is varied, the inductance and capacitance increase or decrease proportionately to thereby tune the filter circuit while maintaining a constant Q.

2. The filter circuit as set forth in claim 1 wherein the filter circuit is formed by placing the synthetic inductor and capacitance multiplier in a feedback path around an op-amp.

3. The filter circuit as set forth in claim 2 additionally comprising a second variable resistor for varying the Q of the filter circuit.

4. The filter circuit as set forth in claim 3 additionally comprising a third resistance for making the Q vary logarithmically with adjustments in the second variable resistor.

5. The filter circuit as set forth in claim 1 wherein the synthetic inductor and capacitance multiplier are configured so as to form a bandpass filter.

6. The filter circuit as set forth in claim 1 wherein the synthetic inductor and capacitance multiplier are configured so as to form a notch filter.

7. The filter circuit as set forth in claim 1 wherein the synthetic inductor and capacitance multiplier are configured so as to form a low pass filter.

8. The filter circuit as set forth in claim 1 wherein the synthetic inductor and capacitance multiplier are configured so as to form a high pass filter.

* * * * *